US011495932B2

(12) United States Patent
Mustafa et al.

(10) Patent No.: US 11,495,932 B2
(45) Date of Patent: Nov. 8, 2022

(54) SLIP RING FOR USE IN ROTATABLE SUBSTRATE SUPPORT

(71) Applicant: APPLIED MATERIALS, INC., Santa Clara, CA (US)

(72) Inventors: Muhannad Mustafa, Santa Clara, CA (US); Yu Chang, San Jose, CA (US); William Kuang, Sunnyvale, CA (US); Muhammad M. Rasheed, San Jose, CA (US); Xiping Huo, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 948 days.

(21) Appl. No.: 16/001,243

(22) Filed: Jun. 6, 2018

(65) Prior Publication Data

US 2018/0358768 A1      Dec. 13, 2018

Related U.S. Application Data

(60) Provisional application No. 62/517,405, filed on Jun. 9, 2017.

(51) Int. Cl.
*H01L 21/687* (2006.01)
*H01R 39/12* (2006.01)
(Continued)

(52) U.S. Cl.
CPC ....... *H01R 39/12* (2013.01); *H01L 21/67103* (2013.01); *H01L 21/67109* (2013.01);
(Continued)

(58) Field of Classification Search
CPC ...... H05K 1/024; H05K 1/0204; H01R 39/12; H01R 13/18; H01R 13/6485;
(Continued)

(56) References Cited

U.S. PATENT DOCUMENTS

| | | | | |
|---|---|---|---|---|
| 4,334,159 A | * | 6/1982 | Ooki | H02K 9/28 310/227 |
| 5,650,679 A | * | 7/1997 | Boggs, III | H01R 39/646 310/105 |
| 6,017,437 A | | 1/2000 | Ting et al. | |
| 6,472,791 B1 | * | 10/2002 | Rehder | H01F 38/18 310/129 |
| 8,261,575 B1 | * | 9/2012 | Holmes | F02M 31/0825 62/505 |
| 2003/0062979 A1 | * | 4/2003 | Rehder | H02K 9/28 336/126 |

(Continued)

FOREIGN PATENT DOCUMENTS

| | | |
|---|---|---|
| JP | 2017188363 A | 10/2017 |
| KR | 10-0844542 B1 | 7/2008 |
| KR | 10-2014-0081644 A | 7/2014 |

*Primary Examiner* — Bryan R Perez
(74) *Attorney, Agent, or Firm* — Moser Taboada

(57) ABSTRACT

Embodiments of a slip ring for use in a rotatable substrate support are provided herein. In some embodiments a slip ring includes a main body having a top wall, a bottom wall, and a sidewall extending between the top and bottom walls, wherein the top wall, bottom wall, and sidewall define an inner volume within the main body, wherein a central opening is formed through the top wall; a plurality of annular containers disposed within the inner volume and coaxially with the main body, wherein the plurality of annular containers are vertically spaced apart from one another, and wherein each of the plurality of annular containers contains a first volume of an electrically conductive liquid; an upper cylindrical body rotatably disposed in the central opening; a lower cylindrical body fixedly coupled to the lower wall of the main body.

20 Claims, 6 Drawing Sheets

(51) Int. Cl.
*H01R 39/18* (2006.01)
*H02K 13/00* (2006.01)
*H01L 21/67* (2006.01)

(52) U.S. Cl.
CPC .. *H01L 21/68742* (2013.01); *H01L 21/68792* (2013.01); *H01R 39/18* (2013.01); *H02K 13/003* (2013.01); *H01L 21/68764* (2013.01)

(58) Field of Classification Search
CPC .. H01R 13/6205; H01R 13/11; H02K 13/003; H01L 21/67103; H01L 21/67109; H01L 21/68742; H01L 21/68792; H01L 21/68764
See application file for complete search history.

(56) References Cited

U.S. PATENT DOCUMENTS

| | | |
|---|---|---|
| 2006/0154569 A1 | 7/2006 | Doyle et al. |
| 2010/0224130 A1* | 9/2010 | Smith ............... H01L 21/68742 118/725 |
| 2015/0083042 A1* | 3/2015 | Kobayashi ........ H01J 37/32082 118/500 |
| 2016/0028199 A1 | 1/2016 | Gerdes et al. |
| 2016/0248304 A1* | 8/2016 | Andreson ................ H02K 5/20 |
| 2016/0379801 A1 | 12/2016 | Suh |
| 2017/0012505 A1* | 1/2017 | Holzapfel .............. H01R 39/46 |
| 2017/0250512 A1* | 8/2017 | Lewis .................... H01R 39/20 |
| 2018/0047547 A1 | 2/2018 | Matsumoto et al. |
| 2019/0028007 A1* | 1/2019 | Ma ........................ H02K 15/03 |
| 2019/0153588 A1* | 5/2019 | Boughton ............. B65G 47/92 |

* cited by examiner

SLIP RING FOR USE IN ROTATABLE SUBSTRATE SUPPORT

CROSS-REFERENCE TO RELATED APPLICATIONS

This application claims benefit of U.S. provisional patent application Ser. No. 62/517,405, filed Jun. 9, 2017, which is herein incorporated by reference in its entirety.

FIELD

Embodiments of the present disclosure generally relate to slip rings for use in rotatable substrate supports.

BACKGROUND

Formation of some devices on substrates calls for multiple layers of thin films which are deposited in a deposition chamber, such as an atomic layer deposition (ALD) chamber. In some embodiments, the substrate needs to be rotated during the deposition process to obtain good film uniformity. Deposition of some layers may also call for the substrate to be heated. A slip ring is typically coupled to a shaft of the substrate support to couple power source(s) and other electrical devices to the substrate support pedestal while allowing the substrate support to rotate.

However, the inventors have observed that typical slip rings do not meet the standards set by code bodies for the spacing between pins of opposite polarity. For example, the National Electrical Code requires that pins mounted on a common surface and having opposite polarities be spaced apart from each other a minimum of 0.75 inches for 208 volt applications.

Therefore, the inventors have provided improved slip rings for use in rotatable substrate supports.

SUMMARY

Embodiments of slip rings for use in rotatable substrate supports are provided herein. In some embodiments a slip ring includes a main body having a top wall, a bottom wall, and a sidewall extending between the top wall and the bottom wall, wherein the top wall, bottom wall, and sidewall define an inner volume within the main body, wherein a central opening is formed through the top wall; a plurality of annular containers disposed within the inner volume and coaxially with the main body, wherein the plurality of annular containers are vertically spaced apart from one another, and wherein each of the plurality of annular containers contains a first volume of an electrically conductive liquid; an upper cylindrical body rotatably disposed in the central opening; a lower cylindrical body fixedly coupled to the lower wall of the main body. The upper cylindrical body includes a plurality of first conductive pins protruding from an upper surface of the upper cylindrical body; and a plurality of first conductive leads, each of which is coupled to a corresponding one of the plurality of first conductive pins and extends into a corresponding first volume of the electrically conductive liquid. The lower cylindrical body includes a plurality of second conductive pins protruding from a lower surface of the lower cylindrical body; and a plurality of second conductive leads, each of which is coupled to a corresponding one of the plurality of second conductive pins and extends to a corresponding annular container to electrically couple the plurality of first conductive pins to the plurality of second conductive pins.

In some embodiments, a slip ring includes a main cylindrical body having a central opening, an upper cylindrical body having an inner sidewall that defines a central opening, where the upper cylindrical body is rotatably disposed in the central opening of the main cylindrical body, and a lower cylindrical body having a central opening, where the lower cylindrical body is disposed in the central opening of the upper cylindrical body and fixed to the main cylindrical body. A plurality of annular containers are disposed between the inner sidewall of the upper cylindrical body and an outer surface of the lower cylindrical body. The plurality of annular containers are vertically arranged with respect to one another and each of the plurality of annular containers contains a first volume of an electrically conductive liquid. A plurality of annular caps are configured to cover the first volume of each corresponding annular container. A plurality of first conductive leads, each of which extends from a corresponding first volume of the electrically conductive liquid to a top surface of the upper cylindrical body, and a plurality of second conductive leads, each of which extends from a corresponding first volume of the electrically conductive liquid to a bottom surface of the lower cylindrical body.

In some embodiments, a slip ring includes a main body having a top wall, a bottom wall, and a sidewall extending between the top and bottom walls to define an inner volume within the main body. The top wall is rotatably connected to the sidewall, and a central opening is formed through the top wall. A plurality of hollow cylinders are disposed within the inner volume, and the plurality of hollow cylinders are coaxial with each other and with the main body. The plurality of hollow cylinders define a plurality of annular channels between adjacent ones of the plurality of hollow cylinders and each of the plurality of annular channels contains a volume of the electrically conductive liquid. A plurality of first conductive pins protrude from an upper surface of the top wall, each first conductive pin electrically connected to a corresponding volume of the electrically conductive liquid. A plurality of second conductive pins protrude from a lower surface of the bottom wall, each second conductive pin electrically connected to a corresponding volume of the electrically conductive liquid to electrically couple the plurality of first conductive pins to the plurality of second conductive pins.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, that the appended drawings illustrate only typical embodiments of the disclosure and are therefore not to be considered limiting of scope, for the disclosure may admit to other equally effective embodiments.

Figure 1:
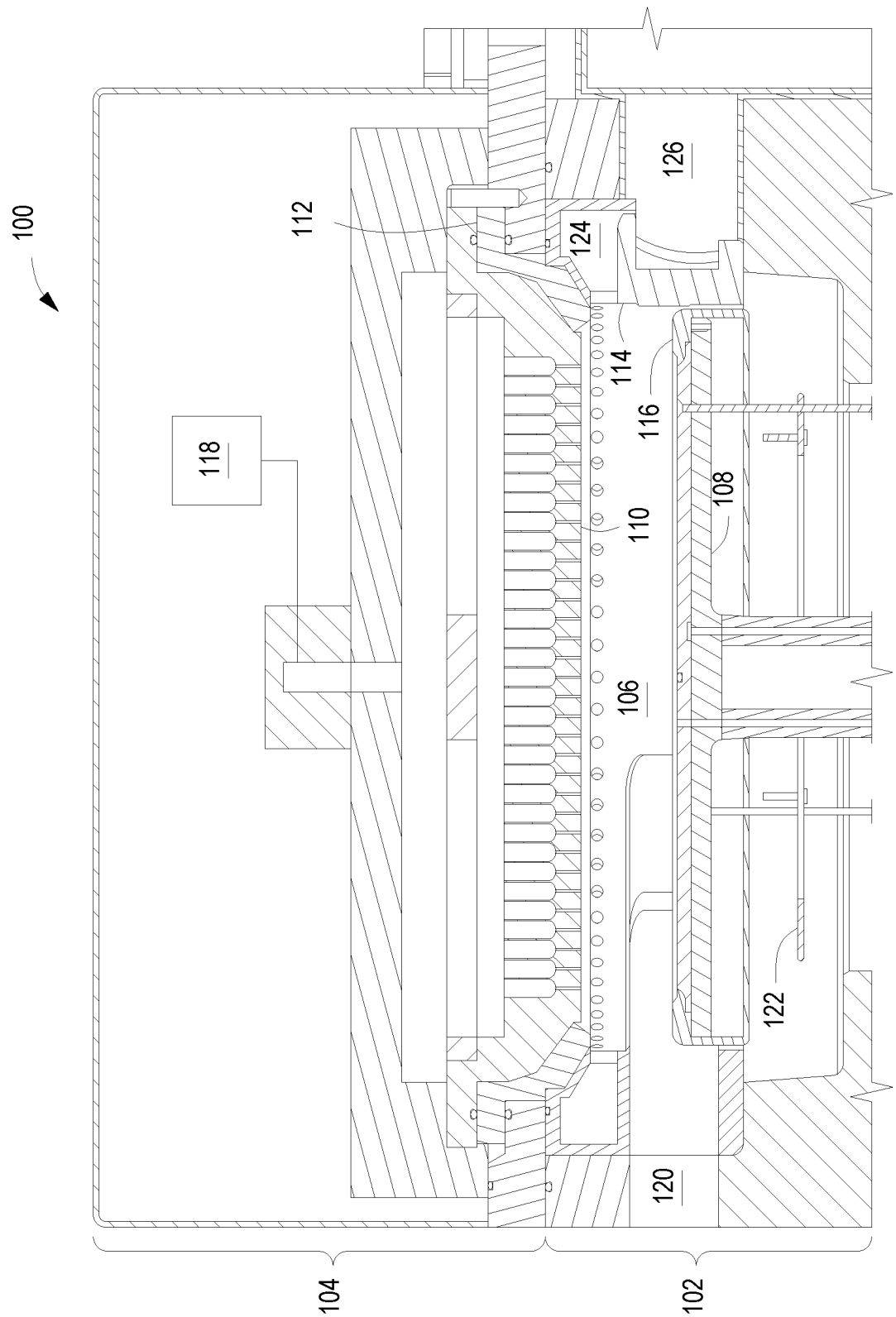
FIG. 1 depicts a schematic side cross-sectional view of a process chamber in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of the present disclosure provide a slip ring that may be used in substrate supports disposed within process chambers, such as atomic layer deposition (ALD) process chambers (although process chambers for performing other processes may also benefit from the teachings disclosed herein). Embodiments include slip rings provide electrical coupling of power sources and other electrical devices to a rotatable substrate support while advantageously complying with codes set by governing bodies. The following process chamber description is provided for context and exemplary purposes, and should not be construed as limiting the scope of the disclosure.

FIG. 1 is a schematic view of an exemplary substrate processing chamber (process chamber 100) in which a slip ring in accordance with some embodiments of the present disclosure may be utilized. In some embodiments, the process chamber 100 includes a chamber body 102 and a lid assembly 104 having a processing volume 106 defined within the chamber body 102 and beneath the lid assembly 104. A slit valve 120 in the chamber body 102 provides access for a robot (not shown) to deliver and retrieve a substrate, such as a 200, 300, 450 mm or the like semiconductor wafer, a glass substrate, or the like, to and from the process chamber 100.

A rotatable substrate support 108 supports a substrate on a substrate receiving surface in the process chamber 100. A lift plate 122, connected to a lift motor (lift motor 220 shown in FIG. 2), is mounted in the process chamber 100 to raise and lower lift pins movably disposed through the substrate support 108. The lift pins raise and lower the substrate over the surface of the substrate support 108. The substrate support 108 may include a vacuum chuck (not shown), an electrostatic chuck (not shown), or a clamp ring (not shown) to secure the substrate to the substrate support 108 during processing.

The temperature of the substrate support 108 may be adjusted to control the temperature of the substrate. For example, substrate support 108 may be heated using an embedded heating element, such as a resistive heater, as discussed below with respect to FIG. 2, or may be heated using radiant heat, such as heating lamps configured to provide heat energy to the substrate support 108.

In some embodiments, an edge ring 116 may be disposed atop a peripheral edge of the substrate support 108. The edge ring 116 includes a central opening sized to expose the support surface of the substrate support 108. The edge ring 116 may further include a skirt, or downwardly extending annular lip to protect the sides of the substrate support 108.

In some embodiments, a liner 114 is disposed along the interior walls (e.g., one or more sidewalls) of the chamber body 102 to protect the chamber body 102 from corrosive gases or deposition of materials during operation. In some embodiments, the liner 114 includes an inner volume 124 and a plurality of openings to fluidly couple the inner volume 124 to the processing volume 106. In such embodiments, the inner volume 124 of the liner 114 is further fluidly coupled to a pumping channel 126 to facilitate evacuation of gases from the process chamber 100 and maintaining a predetermined pressure or pressure range inside the process chamber 100 via a vacuum pump coupled to the pumping channel 126.

A gas delivery system 118 is coupled to the lid assembly 104 to provide a gas, such as a process gas and/or a purge gas, to the processing volume 106 through a showerhead 110. The showerhead 110 is disposed in the lid assembly 104 generally opposite the substrate support 108 and includes a plurality of gas distribution holes to provide process gases to the processing volume 106. In some embodiments, a spacer 112 may be provided to control the position of the showerhead 110 with respect to the substrate support 108 (e.g., the distance between the front face of the showerhead 110 and the support surface of the substrate support 108). For example, in some embodiments, the spacer 112 may be an annular member disposed between the showerhead 110 and a support member in the lid assembly 104. The dimensions of the spacer 112, for example the thickness, may be selected to control the position of the showerhead 110 when resting atop the spacer 112.

Figure 2:
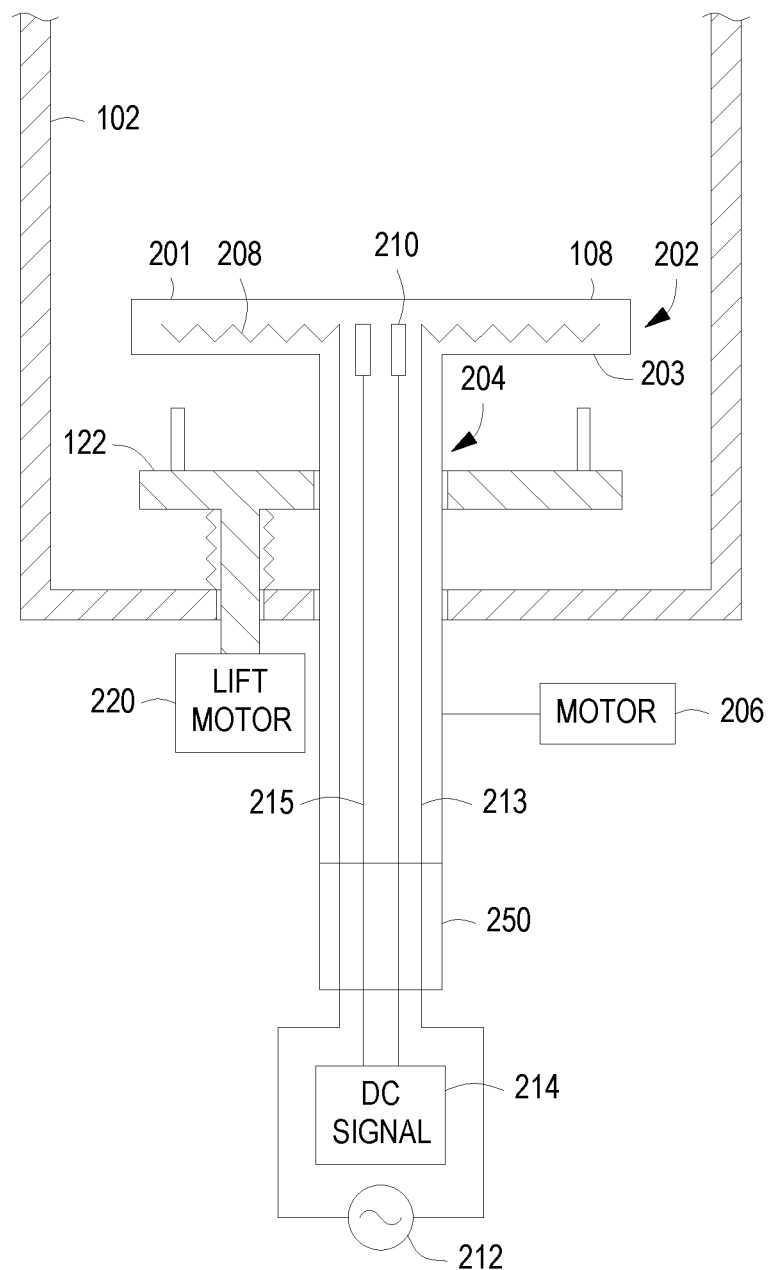
FIG. 2 depicts a schematic view of a substrate support in accordance with some embodiments of the present disclosure.

FIG. 2 depicts a schematic view of the substrate support 108 having a slip ring in accordance with some embodiments of the present disclosure. In some embodiments, the substrate support includes a pedestal 202 having a support surface 201 to support a substrate and a shaft 204 supporting the pedestal 202 and extending down from a second surface 203 opposite the support surface 201. In some embodiments, the substrate support 108 includes one or more heating elements 208 disposed between the support surface 201 and the second surface 203. In some embodiments, the heating elements 208 may be resistive heating elements. In some embodiments, the heating elements 208 may be divided into a plurality of heating zones (e.g., inner and outer heating zones). In some embodiments, a motor 206 is coupled to the shaft 204 to rotate the substrate support 108. The lift motor 220 is coupled to the lift plate 122 to facilitate moving the lift plate up and down to lift and lower the lift pins (not shown) in the substrate support 108.

The substrate support 108 may further include one or more (two shown in FIG. 2) resistive temperature detectors (RTDs) 210 to measure the temperature of the substrate disposed on the support surface 201. The substrate support 108 further includes a power source (e.g., AC power source 212) coupled to the heating elements 208 via first leads 213 to power the heating elements 208 and a signal source (e.g., DC signal source 214) coupled to the RTDs 210 via second leads 215 to send an activating signal to the RTDs 210. A slip ring 250 is disposed in the shaft 204 to facilitate the electrical coupling of the AC power source 212 and the DC signal source 214 to the heating elements 208 and the RTDs, respectively, while allowing the substrate support 108 to rotate.

Figure 3A:
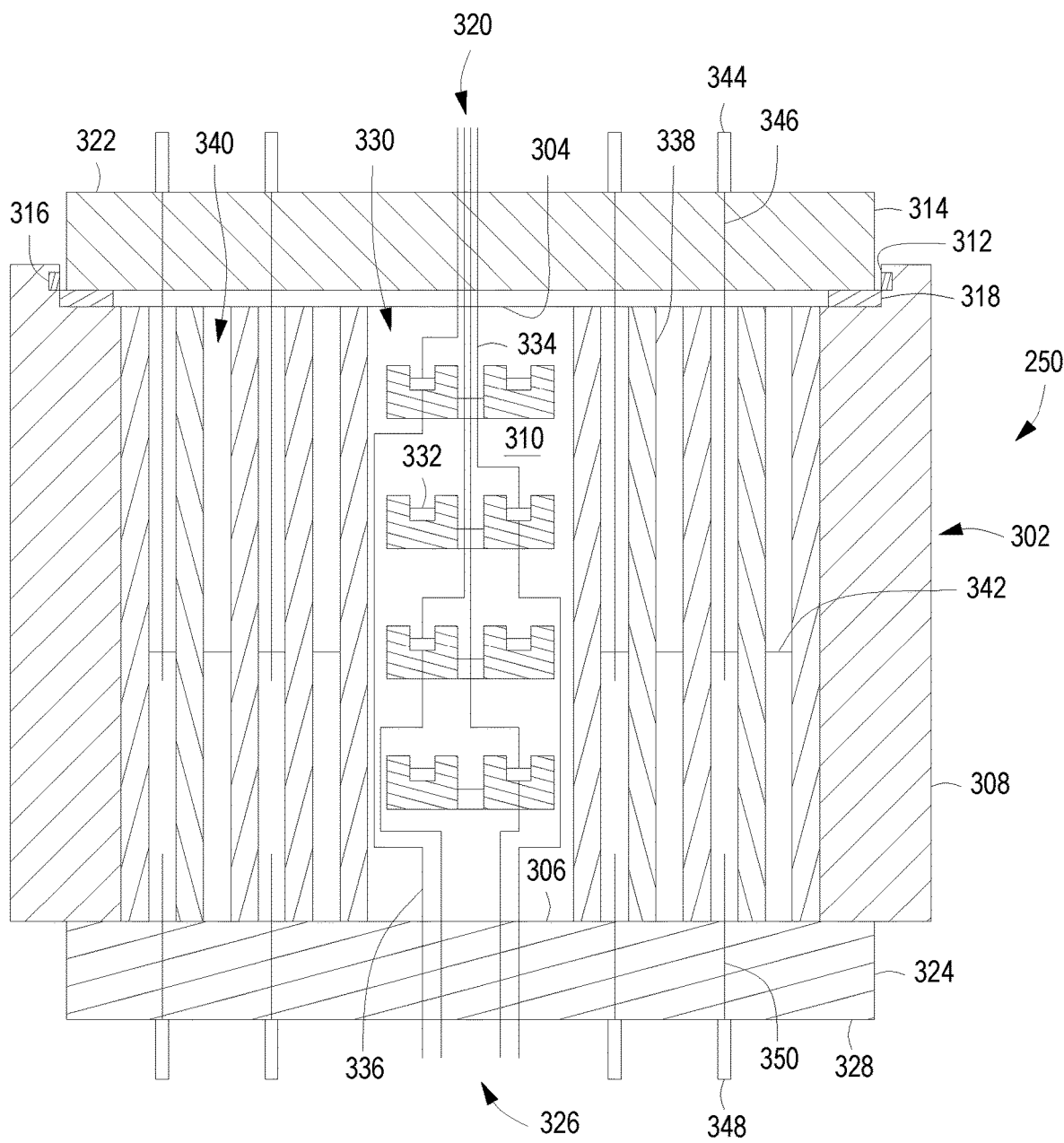
FIG. 3A depicts a cross-sectional view of a slip ring in accordance with some embodiments of the present disclosure.
Figure 3B:
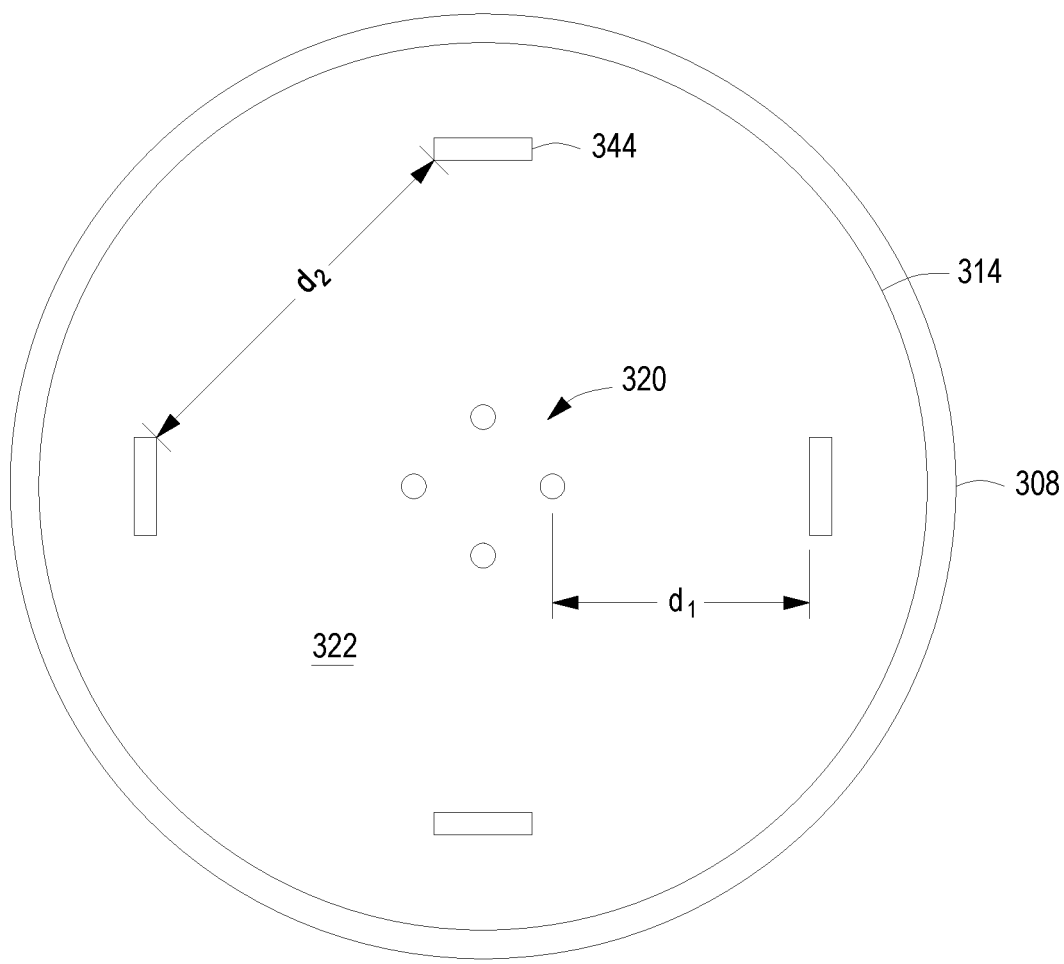
FIG. 3B depicts a top view of the slip ring of FIG. 3A.

The following description of the slip ring 250 is made with reference to FIGS. 3A and 3B. FIG. 3A depicts a cross-sectional view of a slip ring in accordance with some embodiments of the present disclosure. FIG. 3B depicts a top view of the slip ring of FIG. 3A. In some embodiments, the slip ring 250 includes a main body 302 having a top wall 304, a bottom wall 306, and a sidewall 308 extending between the top and bottom walls 304, 306. The top wall 304, the bottom wall 306, and the sidewall 308 define an inner volume 310 within the main body 302. A central opening 312 is formed through the top wall 304 to accommodate an upper cylindrical body 314. The upper cylindrical body 314 is rotatably disposed within the central opening 312. In some embodiments, first and second dynamic seals 316, 318 may be disposed at the interfaces of the upper cylindrical body 314 and the main body 302 to minimize or eliminate wear from the rotation of the upper cylindrical body 314. In some embodiments, the upper cylindrical body 314 includes a plurality of first conductive pins 320 protruding from an upper surface 322 of the upper cylindrical body 314. In some embodiments, the plurality of first conductive pins 320 are adapted to M8 connectors for signal transfer. The slip ring 250 further includes a lower cylindrical body 324 fixedly coupled to the bottom wall 306. In some embodiments, the lower cylindrical body 324 includes a plurality of second conductive pins 326 protruding from a lower surface 328 of the lower cylindrical body 324.

The slip ring 250 further includes a plurality of annular containers 330 disposed within the inner volume 310. The plurality of annular containers 330 are vertically spaced apart from one another and are arranged coaxially with the main body 302. Each of the plurality of annular containers 330 contains a first volume 332 of an electrically conductive liquid. A plurality of first conductive leads 334 are coupled to corresponding ones of the plurality of first conductive pins 320 and extend into corresponding ones of the first volumes 332. A plurality of second conductive leads 336 are coupled to corresponding ones of the plurality of second conductive pins 326 and extend into corresponding ones of the first volume 332 to electrically couple the plurality of first conductive pins 320 to the plurality of second conductive pins 326 via the first volumes 332 of the electrically conductive liquid.

In some embodiments, the slip ring 250 further includes a plurality of hollow cylinders 338 disposed within the inner volume 310. The plurality of hollow cylinders 338 are coaxial with each other and with the main body. The plurality of hollow cylinders 338 are spaced apart to define a plurality of annular channels 340 between adjacent ones of the plurality of hollow cylinders 338. Each of the plurality of annular channels 340 contains a second volume 342 of the electrically conductive liquid.

In some embodiments, the upper cylindrical body 314 further includes a plurality of third conductive pins 344 protruding from the upper surface 322 of the upper cylindrical body 314 and a plurality of third conductive leads 346, each of which is coupled to a corresponding one of the plurality of third conductive pins 344 and extends into a corresponding second volume 342. The lower cylindrical body 324 further includes a plurality of fourth conductive pins 348 protruding from the lower surface 328 of the lower cylindrical body 324 and a plurality of fourth conductive leads 350, each of which is coupled to a corresponding one of the plurality of fourth conductive pins 348 and extends into a corresponding second volume 342 to electrically couple the plurality of third conductive pins 344 to the plurality of fourth conductive pins 348.

In some embodiments, the electrically conductive liquid is mercury because mercury is liquid at room temperature. In some embodiments, the electrically conductive liquid is a liquid metal alloy comprising gallium, indium, and tin. An example of such a liquid metal alloy is GALINSTAN®, available from Geratherm Medical AG of Germany. Any one of the plurality of first conductive pins 320 is spaced apart from any one of the plurality of third conductive pins 344 by a distance of at least $d_1$. In some embodiments, $d_1$ is at least about 0.5 inches. Any one of the plurality of third conductive pins 344 is spaced apart from any other one of the plurality of third conductive pins 344 by a distance of at least $d_2$ to advantageously reduce or eliminate electrical arcing as well as interference with the DC signals. In some embodiments, $d_2$ is at least about 0.75 inches.

In some embodiments, the slip ring 250 includes four first conductive pins 320, four second conductive pins 326, four third conductive pins 344, and four fourth conductive pins 348, as illustrated in FIGS. 3A and 3B. As such, the number of annular containers (first volumes) and second volumes are each also four. However, the exact number of each of the conductive pins, annular containers (first volumes), and second volumes is dependent on the number of heating zones in the pedestal 202. The above description has been made based on the assumption that two heating zones exist. However, any number of heating zones and, therefore, pins may be included in the substrate support 108 and the slip ring 250, respectively.

During use, the upper cylindrical body 314 is coupled to the shaft 204 and, thus, rotates with the shaft 204. The plurality of first conductive pins 320 are coupled to the second leads 215. The plurality of third conductive pins 344 are coupled to the first leads 213. As such, the plurality of first conductive leads 334 and the plurality of third conductive leads 346 rotate in their respective volumes of the electrically conductive liquid. The plurality of second conductive pins 326 are coupled to the DC signal source 214 to electrically transmit the DC signal from the DC signal source 214 through the plurality of second conductive leads 336, through the electrically conductive liquid in the plurality of annular containers 330, through the first conductive leads 334, through the plurality of first conductive pins 320, through the second leads 215, and to the one or more RTDs 210. Similarly, the plurality of fourth conductive pins 348 are coupled to the AC power source 212 to electrically transmit AC power from the AC power source 212 through the plurality of fourth conductive leads 350, through the electrically conductive liquid in the plurality of annular channels 340, through the third conductive leads 346, through the plurality of third conductive pins 344, through the first leads 213, and to the heating elements 208. The plurality of annular containers 330 and the plurality of hollow cylinders 338 are formed of an electrically insulative material to ensure that the electrical flow paths do not interfere with each other or with any other electrical connections in the substrate support 108.

Figure 4:
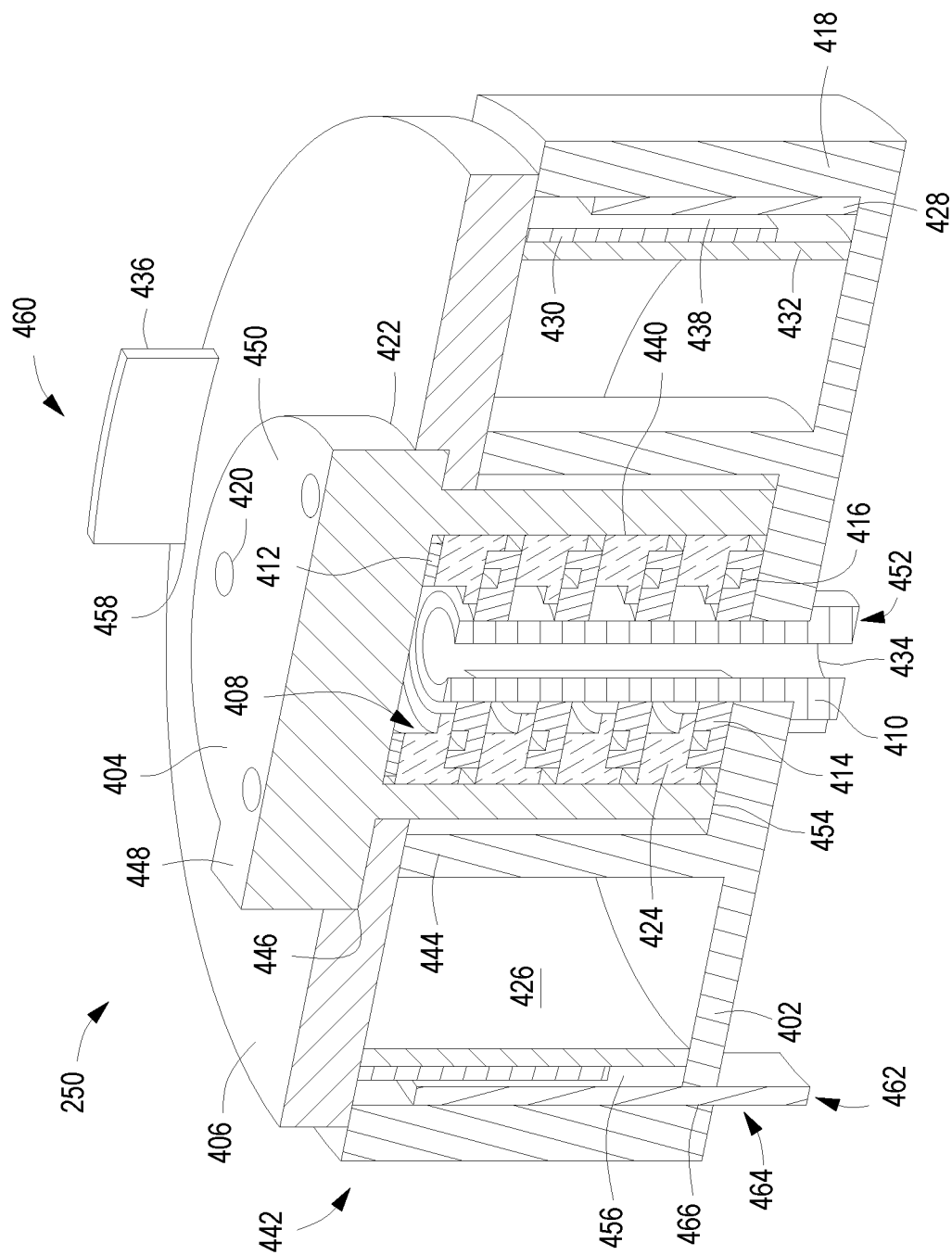
FIG. 4 depicts a cross-sectional isometric view of a slip ring in accordance with some embodiments of the present disclosure.

The following description of the slip ring 250 is made with reference to FIG. 4. FIG. 4 depicts a cross-sectional isometric view of a slip ring in accordance with some embodiments of the present disclosure. In some embodiments, the slip ring 250 includes a main body 442 having a top wall 406, a bottom wall 402, and a first sidewall 418 extending between the peripheral edge of the top and bottom walls 406, 402. In some embodiments, the slip ring 250 further includes a second sidewall 444 extending between the top and bottom walls 406, 402. The top and bottom walls 406, 402 define a first inner volume 408 within the main body 442 between the first and second sidewalls 418, 444. The top wall 406, the bottom wall 402, and the second sidewalls 444 define a second inner volume 426 within the main body 442. A central opening 422 is formed through the top wall 406 to accommodate an upper cylindrical body 404.

The upper cylindrical body 404 is rotatably disposed within the central opening 422 and within the first inner volume 408. In some embodiments, the top wall 406 forms a notched feature 446 along an upper inside peripheral edge of the top wall 406. The notched feature 446 is sized to accommodate a key feature 448 of the upper cylindrical body 404 such that the top wall 406 is capable of rotating with the upper cylindrical body 404. In some embodiments, the upper cylindrical body 404 forms a plurality of holes 420 extending from an upper surface 450 towards a lower surface 454, allowing a plurality of first conductive leads (further described below) to protrude from the upper surface 450 of the upper cylindrical body 404. The upper cylindrical body 404 forms a central opening 440 extending from the lower surface 454 towards the upper surface 450. In some embodiments, the plurality of first conductive leads are adapted to M8 connectors, or other suitable connectors, for signal transfer.

The slip ring 250 further includes a lower cylindrical body 410 disposed at least partially within the central opening 440 of the upper cylindrical body 404 and fixedly coupled to the bottom wall 402. In some embodiments, the lower cylindrical body 410 includes a plurality of second conductive leads (further described below) protruding from a lower surface 452 of the lower cylindrical body 410.

The slip ring 250 further includes a plurality of annular containers 414 disposed within the central opening 440 of the upper cylindrical body 404 and between the upper and lower surfaces 450, 452 of the upper cylindrical body 404. The plurality of annular containers 414 are vertically arranged with respect to one another. The plurality of annular containers 414 are arranged coaxially with the lower cylindrical body 410. The plurality of annular containers can be rotationally fixed to the lower cylindrical body 410. Each of the plurality of annular containers 414 contains a first volume 416 of an electrically conductive liquid. In some embodiments, each of the plurality of annular containers 414 includes a corresponding container lid 424 disposed in the space between adjacent annular containers 414, the container lids 424 configured to cover the first volume 416. Each container lid 424 is capable of rotating with respect to the plurality of annular containers 414. A spring washer 412 may be disposed between the upper surface 450 of the upper cylindrical body 404 and the container lid 424 that is closest to the upper surface 450 to form a compression seal. A stack-up of four annular containers 414 and four container lids are shown in FIG. 4. However, any number of annular containers 414 or container lids 424 may be used to accommodate any number of heating zones in the pedestal 202, or other electrical requirements of the pedestal 202.

In some embodiments, the slip ring 250 further includes a plurality of hollow cylinders disposed within the second inner volume 426. In some embodiments, the plurality of hollow cylinders include a plurality of fixed hollow cylinders 428 that are formed of an electrically conductive material, and a plurality of rotating hollow cylinders 430 that are formed of an electrically conductive material. In some embodiments, the plurality of hollow cylinders can further include a plurality of insulating hollow cylinders 432 that are formed of an insulative material. The plurality of hollow cylinders 428, 430, 432 are coaxial with each other and with the main body 442. The plurality of rotating hollow cylinders 430 are capable of rotating with respect to the plurality of fixed hollow cylinders 428. The plurality of rotating hollow cylinders 430 and the plurality of fixed hollow cylinders 428 are arranged such that each one of the plurality of rotating hollow cylinders 430 is adjacent one of the plurality of fixed hollow cylinders 428 (to form a pair of hollow cylinders) and separated from an adjacent one of the plurality of rotating hollow cylinders 430 by one of the plurality of insulating hollow cylinders 432. The plurality of fixed hollow cylinders 428 and the plurality of rotating hollow cylinders 430 are spaced apart to define a plurality of annular channels 438 therebetween. Each of the plurality of annular channels 438 contains a second volume 456 of the electrically conductive liquid.

In some embodiments, the plurality of rotating hollow cylinders 430 each include a tab 436 that extends through a corresponding slot 458 formed through the top wall 406. Similarly, the plurality of fixed hollow cylinders 428 each include a tab 464 that extends through a corresponding slot 466 formed through the bottom wall 402. The slots may be formed along a peripheral portion of the top and bottom walls 406, 402. The slots can be angularly spaced apart along a peripheral portion of the top and bottom walls 406, 402, with corresponding tabs of the rotating and fixed hollow cylinders 430, 428 positioned accordingly. For example, in an embodiment having four rotating hollow cylinders 430 and four fixed follow cylinders 428, the slots may be formed generally ninety degrees apart about a center of the top and bottom walls 406, 402. The tabs 436 protruding from the top wall 406 define a plurality of first conductive pins 460 and the tabs 464 protruding from the bottom wall 402 define a plurality of second conductive pins 462. Each of the plurality of first conductive pins 460 are therefore electrically coupled to a corresponding one of the plurality of second conductive pins 462 via a corresponding rotating hollow cylinder 430, a corresponding fixed follow cylinder 428, and the second volume 456 of electrically conductive liquid therebetween.

Figure 5:
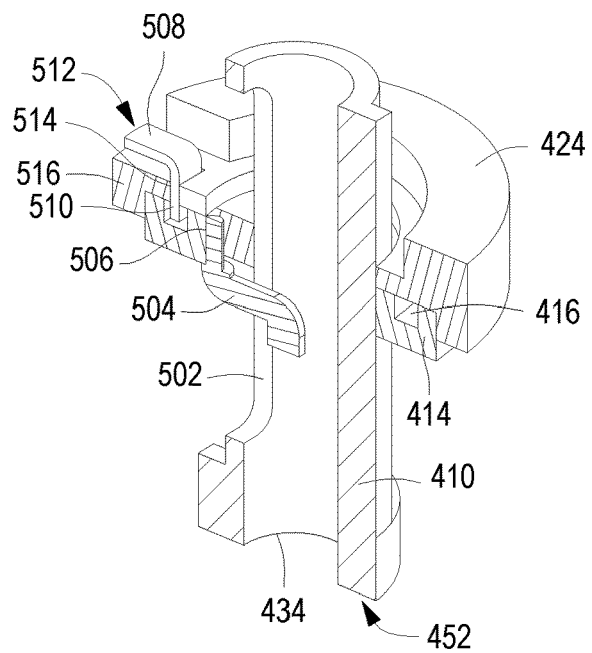
FIG. 5 depicts a cross-sectional isometric view of an inner region of the slip ring of FIG. 4.

FIG. 5 shows a cross-sectional isometric view of an inner region of the slip ring of FIG. 4. In some embodiments, the plurality of annular containers 414 may be formed of an electrically conductive material and the container lid 424 may be formed of an insulative material. A first portion 510 of each one of a plurality of first conductive leads 508 is configured to pass through an opening 514 formed by the container lid 424 and extend into a corresponding one of the first volumes 416. A second portion 512 of the first conductive lead 508 is capable of passing through a corresponding one of the holes 420 of the upper cylindrical body 404 via a ledge 516 formed by the container lid 424. Each one of a plurality of second conductive leads 504 is coupled to an inner sidewall 506 of a corresponding one of the plurality of annular containers 414 to electrically couple the plurality of first conductive leads 508 to the plurality of second conductive leads 504 via the first volumes 416 of the electrically conductive liquid. The lower cylindrical body 410 forms a central opening 434 and a vertical slot 502. The plurality of second conductive leads 504 to extend from the inner sidewall 506 and through the vertical slot 502 and central opening 434 to pass through the lower surface 452.

Figure 6A:
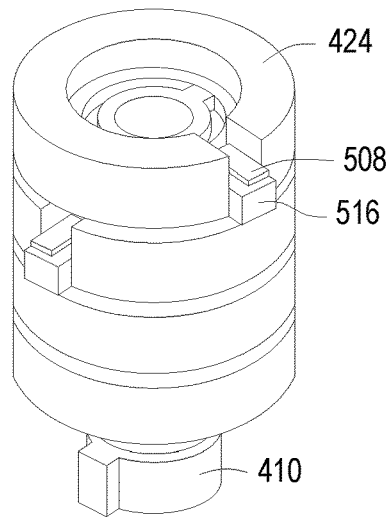
FIG. 6A depicts an isometric view of an inner region of the slip ring of FIG. 4.
Figure 6B:
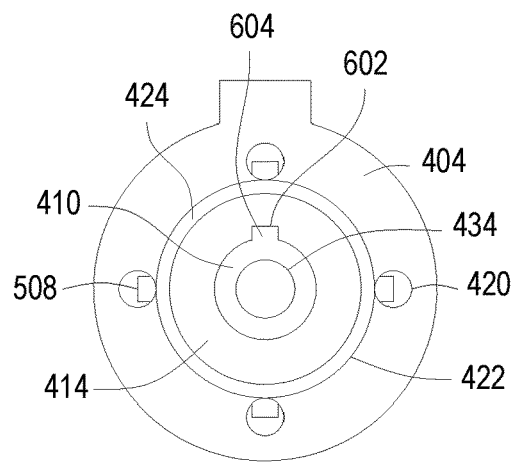
FIG. 6B depicts a bottom view of an inner region of the slip ring of FIG. 4.

FIG. 6A shows an isometric view of an inner region of the slip ring of FIG. 4. In some embodiments, a plurality of annular containers 414 includes four annular containers 414 and four container lids 424, as shown in FIG. 4 and described above. FIG. 6B shows a bottom view of an inner region of the slip ring of FIG. 4. In some embodiments that include four annular containers 414 and four container lids 424, the ledge 516 of each container lid 424 is arranged at a ninety degree angle from adjacent ledges 516. As shown in FIG. 6B, such an arrangement allows for each one of the plurality of first conductive leads 508 to extend through a corresponding one of the plurality of holes 420 of the upper cylindrical body 404. In some embodiments, the plurality of annular containers 414 form a notch 602 that engages with a key 604 formed on the lower cylindrical body 410 to rotationally fix the annular containers 414 to the lower cylindrical body 410.

In some embodiments, any one of the plurality of first conductive pins 460 is spaced apart from any one of the plurality of first conductive leads 508 by a distance of at least 0.5 inches. Any one of the plurality of second conductive pins 462 is spaced apart from any other one of the plurality of second conductive leads 504 by a distance of at least about 0.75 inches to advantageously reduce or eliminate electrical arcing as well as interference with the DC signals.

Thus, the inventors have provided embodiments of slip rings that advantageously comply with spacing requirements set forth in the standards set by the governing code bodies. While the foregoing is directed to some embodiments of the present disclosure, other and further embodiments may be devised without departing from the basic scope thereof.

The invention claimed is:

1. A slip ring, comprising:
a main body having a top wall, a bottom wall, and a sidewall extending between the top wall and the bottom wall, wherein the top wall, bottom wall, and sidewall define an inner volume within the main body, wherein a central opening is formed through the top wall;
a plurality of annular containers disposed within the inner volume and coaxially with the main body, wherein the plurality of annular containers are vertically spaced apart from one another, and wherein each of the plurality of annular containers contains a first volume of an electrically conductive liquid;
an upper cylindrical body rotatably disposed in the central opening, the upper cylindrical body comprising:
a plurality of first conductive pins protruding from an upper surface of the upper cylindrical body; and
a plurality of first conductive leads, each of which is coupled to a corresponding one of the plurality of first conductive pins and extends into a corresponding first volume of the electrically conductive liquid; and
a lower cylindrical body fixedly coupled to the bottom wall of the main body, the lower cylindrical body comprising:
a plurality of second conductive pins protruding from a lower surface of the lower cylindrical body; and
a plurality of second conductive leads, each of which is coupled to a corresponding one of the plurality of second conductive pins and extends to a corresponding annular container to electrically couple the plurality of first conductive pins to the plurality of second conductive pins.

2. The slip ring of claim 1, further comprising:
a plurality of hollow cylinders disposed within the inner volume; wherein the plurality of hollow cylinders are coaxial with each other and with the main body, wherein the plurality of hollow cylinders define a plurality of annular channels between adjacent ones of the plurality of hollow cylinders, wherein each of the plurality of annular channels contains a second volume of the electrically conductive liquid;
wherein the upper cylindrical body further comprises:
a plurality of third conductive pins protruding from the upper surface of the upper cylindrical body; and
a plurality of third conductive leads, each of which is coupled to a corresponding one of the plurality of third conductive pins and extends into a corresponding second volume of the electrically conductive liquid; and
wherein the lower cylindrical body further comprises:
a plurality of fourth conductive pins protruding from the lower surface of the lower cylindrical body; and
a plurality of fourth conductive leads, each of which is coupled to a corresponding one of the plurality of fourth conductive pins and extending into a corresponding second volume of the electrically conductive liquid to electrically couple the plurality of third conductive pins to the plurality of fourth conductive pins.

3. The slip ring of claim 2, wherein the electrically conductive liquid is a liquid metal or a liquid metal alloy.

4. The slip ring of claim 2, wherein the plurality of annular channels defined by the plurality of hollow cylinders have different diameters.

5. The slip ring of claim 2, wherein the plurality of first conductive pins is four first conductive pins, and wherein the plurality of third conductive pins is four third conductive pins.

6. The slip ring of claim 1, further comprising a plurality of hollow cylinders disposed radially outward of the plurality of annular containers.

7. A substrate support, comprising:
a pedestal having an upper surface to support a substrate;
a shaft extending down from a lower surface of the pedestal;
a resistive temperature detector disposed within the substrate support near the pedestal; and
the slip ring of claim 1 connected to the shaft, wherein two of the first conductive pins connect to the resistive temperature detector.

8. The slip ring of claim 1, wherein the plurality of annular containers include an annular groove to contain the first volume.

9. A slip ring, comprising:
a main cylindrical body having a central opening;
an upper cylindrical body having an inner sidewall that defines a central opening, wherein the upper cylindrical body is rotatably disposed in the central opening of the main cylindrical body;
a lower cylindrical body having a central opening, wherein the lower cylindrical body is disposed in the central opening of the upper cylindrical body and fixed to the main cylindrical body;
a plurality of annular containers disposed between the inner sidewall of the upper cylindrical body and an outer surface of the lower cylindrical body, wherein the plurality of annular containers are vertically arranged with respect to one another, and wherein each of the plurality of annular containers contains a first volume of an electrically conductive liquid;
a plurality of container lids configured to cover the first volume of each corresponding annular container;
a plurality of first conductive leads, each of which is electrically connected to a corresponding first volume of the electrically conductive liquid and extends to a top surface of the upper cylindrical body; and
a plurality of second conductive leads, each of which is electrically connected to a corresponding first volume of the electrically conductive liquid and extends to a bottom surface of the lower cylindrical body.

10. The slip ring of claim 9, further comprising:
a plurality of hollow cylinders formed of an electrically conductive material disposed within the central opening of the main cylindrical body; wherein the plurality of hollow cylinders are coaxial with each other and with the main cylindrical body, wherein the plurality of hollow cylinders define a plurality of annular channels between adjacent ones of the plurality of hollow cylinders, and wherein each of the plurality of annular channels contains a second volume of the electrically conductive liquid;

a plurality of first conductive pins protruding from an upper surface of a top wall of the main cylindrical body, each first conductive pin electrically connected to a corresponding volume of the electrically conductive liquid; and a plurality of second conductive pins protruding from a lower surface of a bottom wall of the main cylindrical body, each second conductive pin electrically connected to a corresponding volume of the electrically conductive liquid to electrically couple the plurality of first conductive pins to the plurality of second conductive pins.

11. The slip ring of claim 10, further comprising an insulating hollow cylinder disposed between each pair of the plurality of hollow cylinders.

12. The slip ring of claim 10, wherein a first distance between any one of the plurality of first conductive pins to any one of the plurality of first conductive leads is at least about 0.5 inches.

13. The slip ring of claim 10, wherein a second distance between any two of the plurality of first conductive pins is at least about 0.75 inches.

14. The slip ring of claim 9, wherein the plurality of annular containers are formed of an electrically conductive material.

15. The slip ring of claim 9, wherein the plurality of first conductive leads is four first conductive leads, and wherein the plurality of second conductive leads is four second conductive leads.

16. The slip ring of claim 9, wherein the electrically conductive liquid is a liquid metal or a liquid metal alloy.

17. A slip ring, comprising:
a main body having a top wall, a bottom wall, and a sidewall extending between the top wall and the bottom wall to define an inner volume within the main body, wherein the top wall is rotatably connected to the sidewall, and wherein a central opening is formed through the top wall;

a plurality of hollow cylinders disposed within the inner volume; wherein the plurality of hollow cylinders are coaxial with each other and with the main body, wherein the plurality of hollow cylinders define a plurality of annular channels between adjacent ones of the plurality of hollow cylinders, wherein and wherein each of the plurality of annular channels contains a volume of electrically conductive liquid;

a plurality of first conductive pins protruding from an upper surface of the top wall, each first conductive pin electrically connected to a corresponding volume of the electrically conductive liquid; and a plurality of second conductive pins protruding from a lower surface of the bottom wall, each second conductive pin electrically connected to a corresponding volume of the electrically conductive liquid to electrically couple the plurality of first conductive pins to the plurality of second conductive pins.

18. The slip ring of claim 17, further comprising an insulating hollow cylinder disposed between each pair of the plurality of hollow cylinders.

19. The slip ring of claim 18, wherein each of the plurality of hollow cylinders forms a tab that extends through and protrudes from at least one of the top wall and the bottom wall.

20. The slip ring of claim 17, further comprising:
a plurality of annular containers disposed within the inner volume and coaxially with the main body, wherein the plurality of annular containers are vertically arranged with respect to one another, and wherein each of the plurality of annular containers contains a second volume of an electrically conductive liquid;

a plurality of first conductive leads protruding from an upper surface of the top wall and extending into a corresponding second volume of the electrically conductive liquid; and a plurality of second conductive leads protruding from a lower surface of the bottom wall and electrically connected to a corresponding second volume of the electrically conductive liquid to electrically couple the plurality of first conductive leads to the plurality of second conductive leads.

* * * * *